United States Patent
Ke et al.

(10) Patent No.: US 8,597,964 B2
(45) Date of Patent: Dec. 3, 2013

(54) MANUFACTURING METHOD OF LED PACKAGE STRUCTURE

(75) Inventors: Chih-Hsun Ke, Hsinchu (TW);
Ming-Ta Tsai, Hsinchu (TW);
Chao-Hsiung Chang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/443,888

(22) Filed: Apr. 11, 2012

(65) Prior Publication Data
US 2013/0034920 A1   Feb. 7, 2013

(30) Foreign Application Priority Data
Aug. 1, 2011  (CN) .......................... 2011 1 0217779

(51) Int. Cl.
*H01L 33/60* (2010.01)
(52) U.S. Cl.
USPC .................. 438/27; 438/26; 438/51; 438/106; 438/29; 438/108; 257/24; 257/25; 257/28; 257/88; 257/99; 257/E33.06; 257/E23.001; 257/E23.194
(58) Field of Classification Search
USPC ............. 438/15, 25, 26, 51, 106, 29, 99, 108, 438/123, 124, 125, 128, 689, 700
See application file for complete search history.

(56) References Cited

U.S. PATENT DOCUMENTS

| | | | |
|---|---|---|---|
| 2004/0180459 A1* | 9/2004 | Hsu .................................. | 438/26 |
| 2008/0048205 A1* | 2/2008 | Okazaki ........................... | 257/99 |
| 2009/0108271 A1 | 4/2009 | Chou et al. | |
| 2009/0166664 A1* | 7/2009 | Park et al. ........................ | 257/99 |
| 2009/0315056 A1* | 12/2009 | Kim ................................. | 257/98 |
| 2010/0047942 A1* | 2/2010 | Lin et al. .......................... | 438/27 |
| 2011/0068358 A1* | 3/2011 | Kuo et al. ........................ | 257/98 |
| 2011/0095310 A1* | 4/2011 | Komatsubara et al. .......... | 257/88 |
| 2011/0169042 A1 | 7/2011 | Wu et al. | |
| 2011/0266586 A1* | 11/2011 | Shen et al. ....................... | 257/99 |

FOREIGN PATENT DOCUMENTS

| | | |
|---|---|---|
| TW | 200919779 A | 5/2009 |
| TW | 201125177 A | 7/2011 |

* cited by examiner

*Primary Examiner* — Jerome Jackson, Jr.
*Assistant Examiner* — Bo Fan
(74) *Attorney, Agent, or Firm* — Altis Law Group, Inc.

(57) ABSTRACT

A method for manufacturing a plurality of holders each being for an LED package structure includes steps: providing a base, pluralities of through holes being defined in the base to divide the base into a plurality of basic units; etching the base to form a dam at an upper surface of each of the basic units of the base; forming a first electrical portion and a second electrical portion on each basic unit of the base, the first electrical portion and the second electrical portion being separated and insulated from each other by the dam; providing a plurality of reflective cups each on a corresponding basic unit of the base, each of the reflective cups surrounding the corresponding dam; and cutting the base into the plurality of basic units along the through holes to form the plurality of holders.

8 Claims, 9 Drawing Sheets

MANUFACTURING METHOD OF LED PACKAGE STRUCTURE

BACKGROUND

1. Technical Field

The disclosure relates a manufacturing method of an LED (light emitting diode) package structure, and particularly to a manufacturing method of a holder of the LED package structure.

2. Discussion of Related Art

Light emitting diodes' (LEDs) many advantages, such as high luminosity, low operational voltage, low power consumption, compatibility with integrated circuits, easy driving, long term reliability, and environmental friendliness have promoted their wide use as a lighting source.

A typical LED package structure includes a base, first and second electrodes secured to the base, a plurality of LEDs arranged on the base and electrically connected to the first and second electrodes, a dam formed on the base to separate the LEDs, and a projection arranged on the base and surrounding the LEDs. The projection is used to receive encapsulation therein, which covers the LEDs. The projection also functions as a reflector for reflecting light from the LEDs. However, the dam and the base which are parts of a holder of the LED package structure, are formed in different steps; therefore, the method for manufacturing the typical LED package structure is complicated, and the manufacturing cost thereof is high.

Therefore, what is needed is a method for manufacturing an LED package structure, particularly for manufacturing a holder thereof which can overcome the described limitations.

BRIEF DESCRIPTION OF THE DRAWINGS

Many aspects of the disclosure can be better understood with reference to the following drawing. The components in the drawing are not necessarily drawn to scale, the emphasis instead being placed upon clearly illustrating the principles of the present light emitting diode package for microminiaturization. Moreover, in the drawing, like reference numerals designate corresponding parts throughout the whole view.

DETAILED DESCRIPTION OF EMBODIMENTS

Referring to FIGS. 1 to 9, a method for manufacturing an LED package structure, in accordance with an embodiment, is provided, which includes the following steps.

Figure 1:
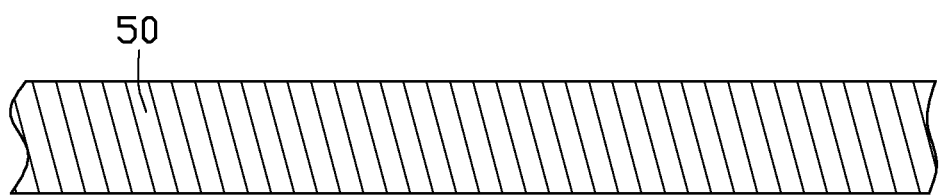
FIG. 1 to FIG. 8 are cross-sectional views showing different steps of an embodiment of a method for manufacturing an LED package structure, according to an exemplary embodiment of the present disclosure.
Figure 2:
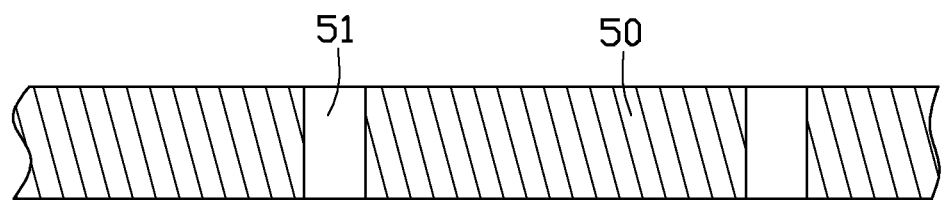

Referring to FIGS. 1 and 2, the first step is to provide a base 50. The base 50 can be made of epoxy, silicone, silicon oxide or a mixture thereof. Preferably, the base 50 is made of thermally conductive and electrically insulating material. The base 50 is etched or machined to define a plurality of through holes 51. The through holes 51 divide the base 50 into a plurality of basic units.

Figure 3:
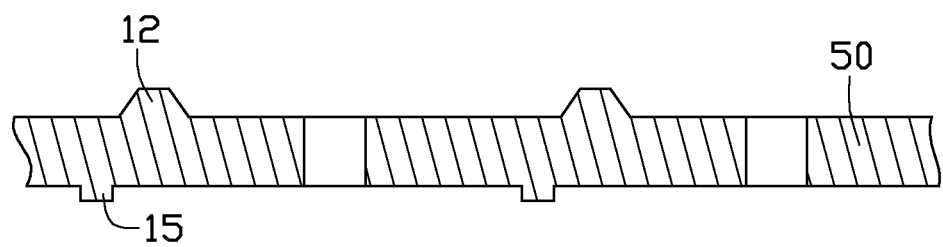

Referring to FIG. 3 also, the second step is to etch a top surface of the base 50 to form a dam 12 at the top surface of each basic unit, and to etch a bottom surface of the base 50 to form a protrusion 15 at the bottom surface of each basic unit.

Figure 4:
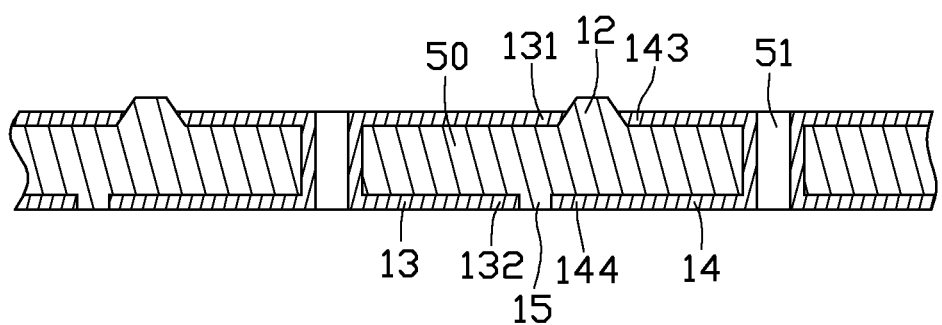

Referring to FIG. 4, the third step is to form a first electrical portion 13 and a second electrical portion 14 on each basic unit of the base 50. The first electrical portion 13 and the second electrical portion 14 are electrically insulated from each other. The first electrical portion 13 and the second electrical portion 14 can be made of metal such as copper (Cu), nickel (Ni), silver (Ag), aluminum (Al), tin (Sn), gold (Au) or an alloy thereof, or made of oxides such as indium tin oxide (ITO). A cross-section of each of the first or second electrical portions 13, 14 is U-shaped and oriented horizontally. The first electrical portion 13 and the second electrical portion 14 are respectively formed at two opposite lateral sides of each basic unit and insulated and separated from each other by the dam 12 and the protrusion 15. Two opposite first ends 131, 132 of the first electrical portion 13 are respectively adjoining to left sides of the dam 12 and the protrusion 15, and two opposite second ends 143, 144 of the second electrical portion 14 are respectively adjoining to right sides of the dam 12 and the protrusion 15 and opposite to the first ends 131, 132 of the first electrical portion 13.

Figure 5:
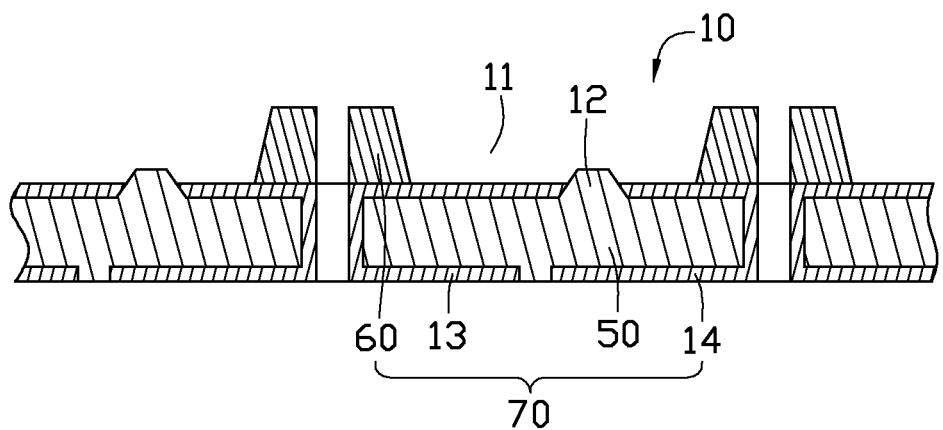

Referring to FIG. 5, the fourth step is to provide a plurality of reflective cups 60 each mounted on a corresponding basic unit of the base 50. Each of the reflective cups 60 is annular and surrounds the dam 12. The reflective cup 60 defines a space 11 therein to receive the dam 12. The reflective cup 60 can be made of a light reflective material completely, or only has an inner surface thereof coated with a light reflective material. Preferably, the reflective cup 60 is made of thermally conductive and electrically insulating material. The reflective cup 60 can be adhered on or bonded with the basic unit of the base 50. Thereby, holders 80 each including the base 50, the first and second electrical portions 13, 14 and the reflective cup 60 are formed.

Figure 6:
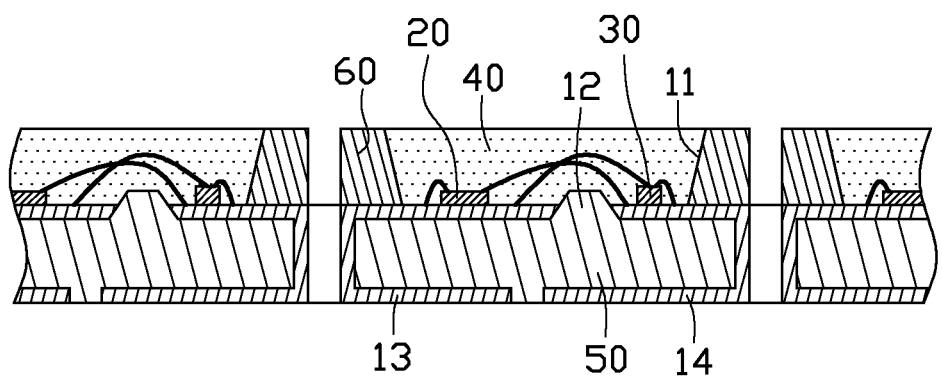

Referring to FIG. 6, the fifth step is to secure a first LED chip 20 on the first electrical portion 13 and a second LED chip 30 on the second electrical portion 14. The first LED chip 20 is separated from the second LED chip 30 by the dam 12. The dam 12 is used to prevent interference of light beams of the two LED chips 20, 30, which are different type LED chips respectively emitting light beams of short wavelength (for example, blue light) and long wavelength (for example, red light). In addition, the dam 112 is used as an additional reflector for increasing the light extracting efficiency of the LED package structure 100. A first electrode and a second electrode (not labeled) of the first LED chip 20 are electrically connected to the first and second electrical portion 13, 14 via wires, respectively. A first electrode (not labeled) of the second LED chip 30 is electrically connected to the first electrical portion 13 via a wire, while a second electrode (not labeled) of the second LED chip 30 is directly mounted to the second electrical portion 14. In the present embodiment, an encapsulation 40 is received in the space 11 of the reflective cup 60 and covers the first and second LED chips 20, 30. A top surface of the encapsulation 40 is substantially coplanar with a top surface of the reflector cup 60.

Figure 7:
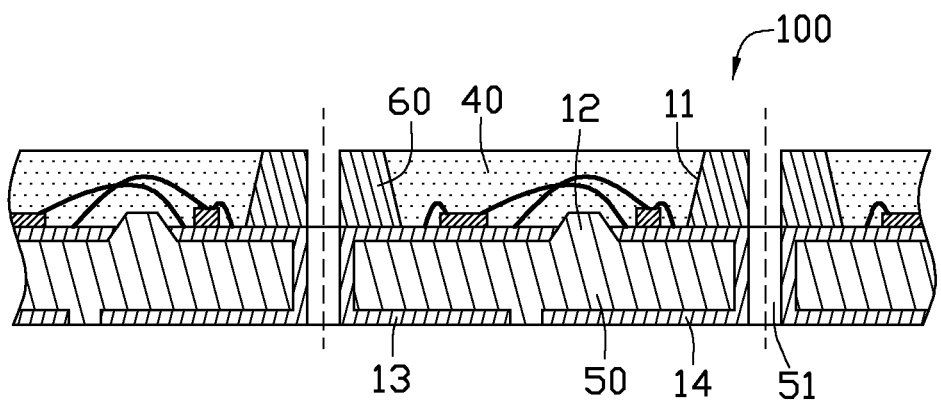

Referring to FIG. 7, the sixth step is to cut the base 50 into the plurality of basic unit, thereby forming a plurality of LED package structures 100. Alternatively, the sixth step can be arranged before the fifth step. In other words, the step of cutting the base 50 into the holders 80 is before the step of securing the first LED chip 20 on the first electrical portion 13 and securing the second LED chip 30 on the second electrical portion 14.

Figure 8:
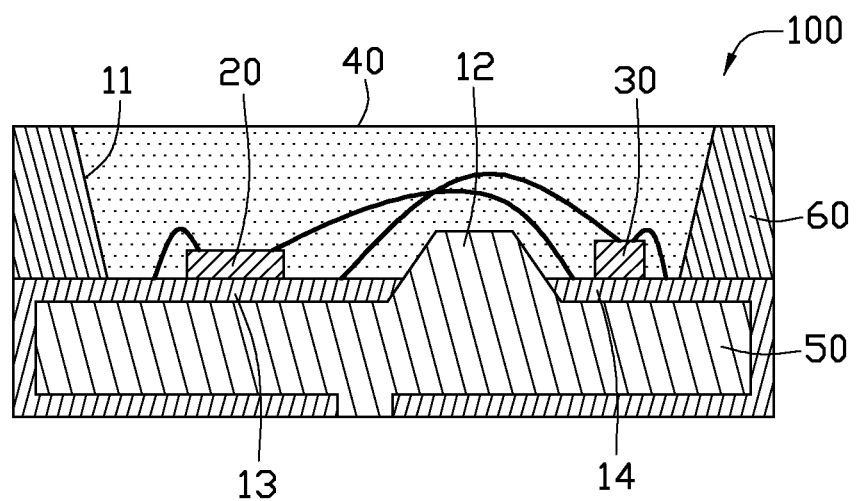
Figure 9:
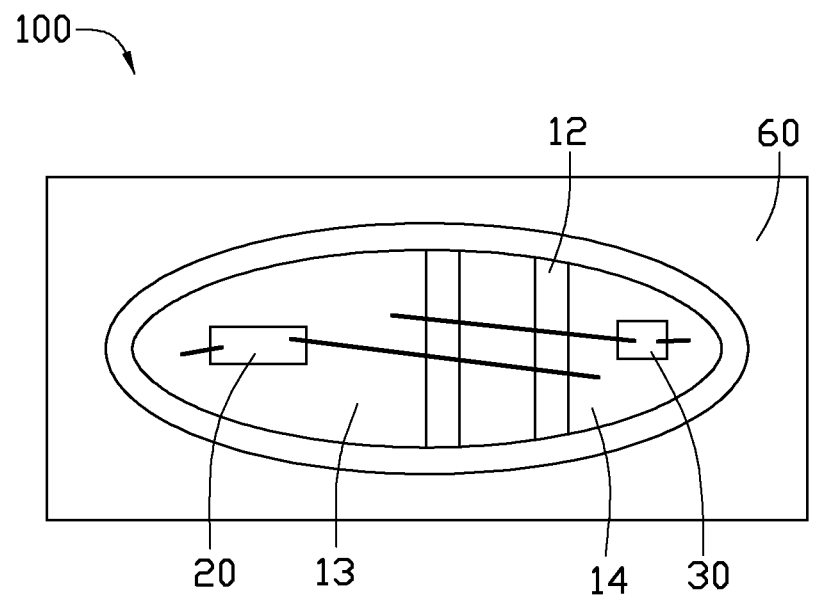
FIG. 9 is a top view of the LED package structure of FIG. 8.

Referring to FIGS. 8 and 9, in each of the LED package structures 100, the dam 12 is integrally formed with the base 50 as a single piece; therefore, the method for manufacturing the LED package structure 100, particularly for manufacturing the holder 70 thereof which includes the base 50 with the dam 12, and the reflector cup 60 is easier, and the manufacturing cost is reduced, compared with the conventional manufacturing method.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A method for manufacturing a plurality of holders each being for an LED package structure, comprising:
    providing a base, a plurality of through holes being defined in the base to divide the base into a plurality of basic units;
    etching the base to form a dam at an upper surface of each of the basic units of the base;
    forming a first electrical portion and a second electrical portion on each basic unit of the base, the first electrical portion and the second electrical portion being separated and insulated from each other by the dam;
    providing a plurality of reflective cups each on a corresponding basic unit of the base, each of the reflective cups surrounding a corresponding dam; and
    cutting the base into the plurality of basic units along the through holes to form the plurality of holders;
    wherein the base is etched to form a protrusion at a bottom surface of each of the basic units of the base opposite to the corresponding dam, the first electrical portion and the second electrical portion being separated and insulated from each other by the protrusion;
    wherein the protrusion and dam are integrally formed with the base; and
    wherein the first and second electrical portions each are U-shaped and formed at the two opposing upper and lower side surfaces of the corresponding basic unit of the base.

2. The method of claim 1, wherein the through holes are etched or machined to be defined in the base.

3. The method of claim 1, wherein the reflective cup is adhered on or bonded with the corresponding basic unit of the base.

4. A method for manufacturing a plurality of LED package structures, comprising:
    providing a base, a plurality of through holes being defined in the base to divide the base into a plurality of basic units;
    etching the base to form a dam at an upper surface of each of the basic units of the base;
    forming a first electrical portion and a second electrical portion on each basic unit of the base, the first electrical portion and the second electrical portion being separated and insulated from each other by the dam;
    providing a plurality of reflective cups each on a corresponding basic unit of the base, each of the reflective cups surrounding a corresponding dam;
    setting a first LED chip on the first electrical portion and a second LED chip on the second electrical portion and electrically connecting the first and second LED chips with the first and second electrical portions; and
    cutting the base into the plurality of basic units along the through holes to form the plurality of LED package structures;
    wherein the base is etched to form a protrusion at a bottom surface of each of the basic units of the base opposite to the corresponding dam, the first electrical portion and the second electrical portion being separated and insulated from each other by the protrusion;
    wherein the protrusion and dam are integrally formed with the base; and
    wherein the first and second electrical portions each are U-shaped and formed at the two opposing upper and lower side surfaces of the corresponding basic unit of the base.

5. The method of claim 4, wherein the through holes are etched or machined to be defined in the base.

6. The method of claim 4, wherein the reflective cup is adhered on or bonded with the corresponding basic unit of the base.

7. The method of claim 4, wherein the first LED chip is separated from the second LED chip by the corresponding dam.

8. A method for manufacturing an LED package structure with a holder, comprising:
    providing a base;
    etching the base to form a dam at an upper surface thereof;
    forming a first electrical portion and a second electrical portion on the base, the first electrical portion and the second electrical portion being separated and insulated from each other by the dam;
    providing a reflective cup on the base, the reflective cup surrounding the dam; and setting a first LED chip on the first electrical portion and a second LED chip on the second electrical portion and electrically connecting the first and second LED chips with the first and second electrical portions;
    wherein the base is etched to form a protrusion at a bottom surface of each of the basic units of the base opposite to the corresponding dam, the first electrical portion and the second electrical portion being separated and insulated from each other by the protrusion;
    wherein the protrusion and dam are integrally formed with the base; and
    wherein the first and second electrical portions each are U-shaped and formed at the two opposing upper and lower side surfaces of the corresponding basic unit of the base.

* * * * *